(12) United States Patent
Lin (10) Patent No.: US 8,193,012 B2
(45) Date of Patent: Jun. 5, 2012

(54) LED MODULE FABRICATION METHOD

(75) Inventor: Hsuan-Chih Lin, Yonghe (TW)

(73) Assignee: KWO Ger Metal Technology, Inc., Shulin, Taipei Hsien (TW)

( * ) Notice: Subject to any disclaimer, the term of this patent is extended or adjusted under 35 U.S.C. 154(b) by 195 days.

(21) Appl. No.: 12/779,589

(22) Filed: May 13, 2010

(65) Prior Publication Data
US 2010/0311193 A1 Dec. 9, 2010

(30) Foreign Application Priority Data
Jun. 3, 2009 (TW) .............................. 98118434 A (51) Int. Cl.
*H01L 33/00* (2010.01)
(52) U.S. Cl. ........ 438/25; 438/29; 438/34; 257/E21.499
(58) Field of Classification Search .............. 438/26–34, 438/108, 112, 122–124, 126–127; 257/E21.499, 257/E21.503, E21.506
See application file for complete search history.

(56) References Cited

U.S. PATENT DOCUMENTS
2007/0241357 A1* 10/2007 Yan ................................. 257/98
* cited by examiner

*Primary Examiner* — Thanhha Pham
(74) *Attorney, Agent, or Firm* — Muncy, Geissler, Olds & Lowe, PLLC (57) ABSTRACT

A method of fabricating a LED module by: bonding one or multiple LED chips and multiple conducting terminals to a circuit substrate, and then molding a packing cup on the circuit substrate over by over molding for enabling the LED chip(s) and the conducting terminals to be exposed to the outside of the packing cup, and then molding a lens on the packing cup and the LED chip(s) by over-molding. By means of directly molding the lens on the packing cup and the LED chip(s), no any gap is left in the lens, avoiding deflection, total reflection or light attenuation and enhancing luminous brightness and assuring uniform distribution of output light.

12 Claims, 9 Drawing Sheets

LED MODULE FABRICATION METHOD

This application claims the priority benefit of Taiwan patent application number 098118434, filed on Jun. 3, 2009.

BACKGROUND OF THE INVENTION

1. Field of the Invention

The present invention relates to a method for fabricating LED modules and more particularly, to such a LED module fabrication method, which employs an over molding technique to primarily mold a packing cup on a circuit substrate around a LED chip and then to secondarily mold a lens on the LED chip and the packing cup, so that no any gap is left in the lens, avoiding deflection, total reflection or light attenuation.

2. Description of the Related Art

Many different lighting fixtures using different light-emitting techniques are commercially available. Nowadays, LED (light emitting diode) has been intensively used in embedded lamps, head lamps and many other different lighting fixtures for the advantages of excellent photoelectric conversion efficiency, constant wavelength, adjustability of luminous flux and light quality, small size, low heat value and long lifespan.

Following fast development of LED material and packaging technologies, high performance and high brightness LED modules have been intensively used in signboards, vehicle head lamps and outdoor lightings to substitute for conventional lamp bulbs or lamp tubes. Conventional LED modules usually adopt chip-on-board packaging. Chip-on-board packaging is a semiconductor assembly technology where the LED chip or die is directly mounted on the circuit board. This packaging technology is a small-sized surface mount technology. The chip or die is electrically connected to the contacts at the circuit board or circuit substrate by wire bonding. After wire bonding, an encapsulation technique is employed to cover the bonding wires and the chip or die with a resin.

Figure 9:
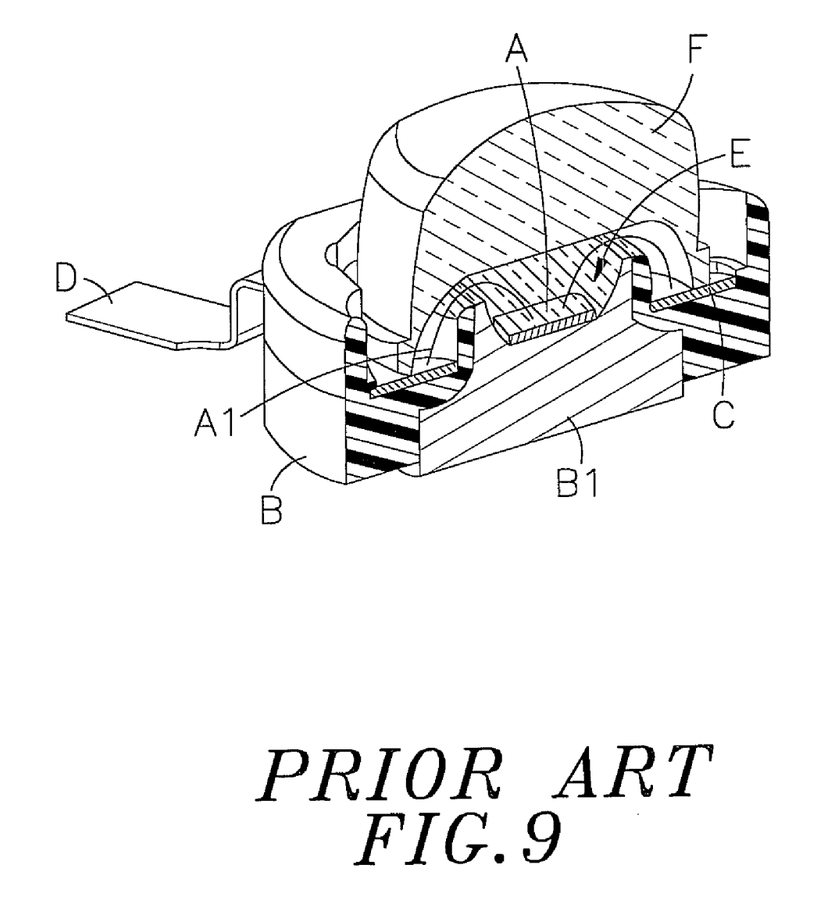
FIG. 9 is a schematic sectional elevation of a LED module according to the prior art.

FIG. 9 illustrates a conventional chip-on-board LED module. According to this packaging method, a LED chip A is mounted on a heat sink B1 in an insulation layer B, and then conducting wires A1 are respectively bonded to the LED chip A and positive and negative metal terminals C;D that extend through the insulation layer B, and then a packaging resin E is packaged on the LED chip A, and then a lens F is bonded to the resin E. This design of chip-on-board LED module has drawbacks as follows:

1. The packaging resin E is adapted for protecting the LED chip A and allowing transfer of waste heat from the LED chip A to the outside. However, when the light emitted by the LED chip A passes through the packaging resin E into the lens F, it is refracted at the first time. When the light passes out of the lens F, it is refracted at the second time. In order to eliminate aging of the packaging resin E, a glass lens used and directly bonded to the LED chip A. However, directly bonding a glass lens to the LED chip A cannot eliminate the problem of existence of a gap in between the glass lens and the LED chip A. The presence of gaseous media in between the glass lens and the LED chip A will cause deflection, total reflection or light attenuation.

2. When soldering the LED chip A to the circuit substrate by surface mount technology, it is performed at a high temperature about 250° C. to 300° C. During this stage, the packaging resin E is heated to cause aging, and the lens F is heated to contract. Aging of the packaging resin E affects the performance of surface mount technology. Contracting of the lens F causes a curvature change, affecting the entire optical quality and lowering the luminous brightness and uneven distribution of light.

Therefore, it is desirable to provide a LED module packaging method, which eliminates the aforesaid problems.

SUMMARY OF THE INVENTION

The present invention has been accomplished under the circumstances in view. It is the main object of the present invention to provide a LED module fabrication method, which is practical for fabricating a LED module that eliminates deflection, total reflection and light attenuation, and that enhances luminous brightness and assures uniform distribution of output light.

To achieve this and other objects of the present invention, a LED module fabrication method comprises a first step of bonding one or multiple LED chips and multiple conducting terminals to a circuit substrate, a second step of molding a packing cup on the circuit substrate over by over molding for enabling the LED chip(s) and the conducting terminals to be exposed to the outside of the packing cup, and a third step of molding a lens on the packing cup and the LED chip(s) by over-molding. By means of directly molding the lens on the packing cup and the LED chip(s), no any gap is left in the lens, avoiding deflection, total reflection or light attenuation and enhancing luminous brightness and assuring uniform distribution of output light.

Further, the LED module fabrication method further comprises a sub-step of forming a reflection mirror on the outer surface of the packing cup around the at least one LED chip by means of metal coating, screen printing or spray painting techniques, improving light extraction efficiency.

The LED module fabrication method further comprises a sub-step of forming a brightness enhancement film on the outer surface of the lens by means of single-layer coating method or multilayer coating method for light interference and ultraviolet light filtration to enhance the brightness of visible light passing therethrough.

The LED module fabrication method further comprises a sub-step of forming a locating groove on the bottom wall of the packing cup around the circuit substrate for the mounting of a water seal ring to prohibit entrance of outside moisture and dust from entering the packing cup, avoiding a short circuit, failure or any damage.

DETAILED DESCRIPTION OF THE PREFERRED EMBODIMENT

Figure 1:
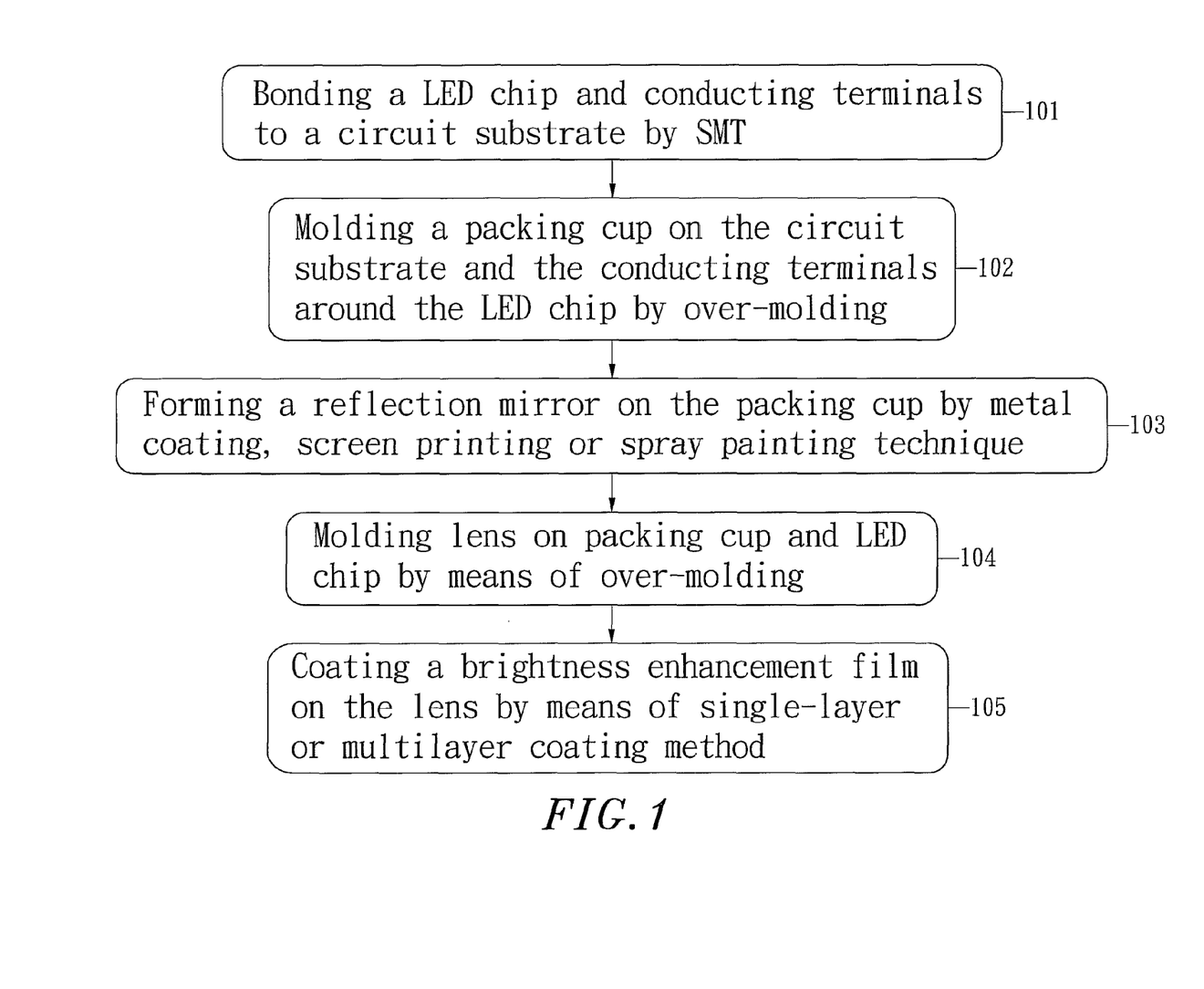
FIG. 1 is a LED module fabrication flow chart according to the present invention.
Figure 2:
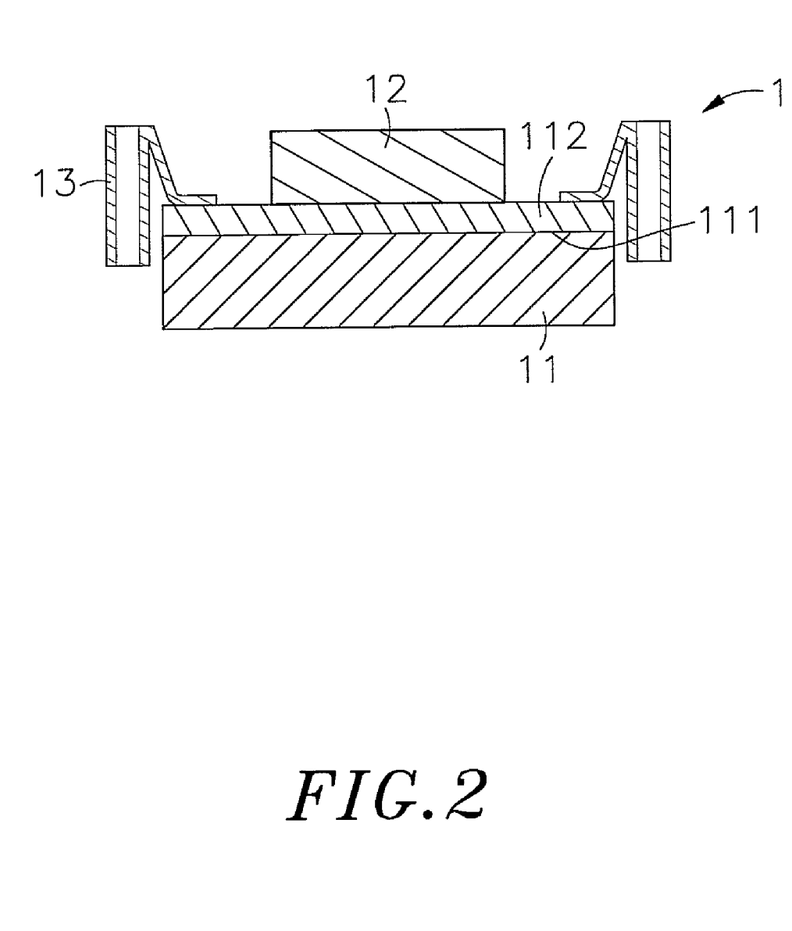
FIG. 2 is a schematic sectional side view, showing a LED chip and two conducting terminals bonded to a circuit substrate during the fabrication of a LED module according to the present invention.
Figure 3:
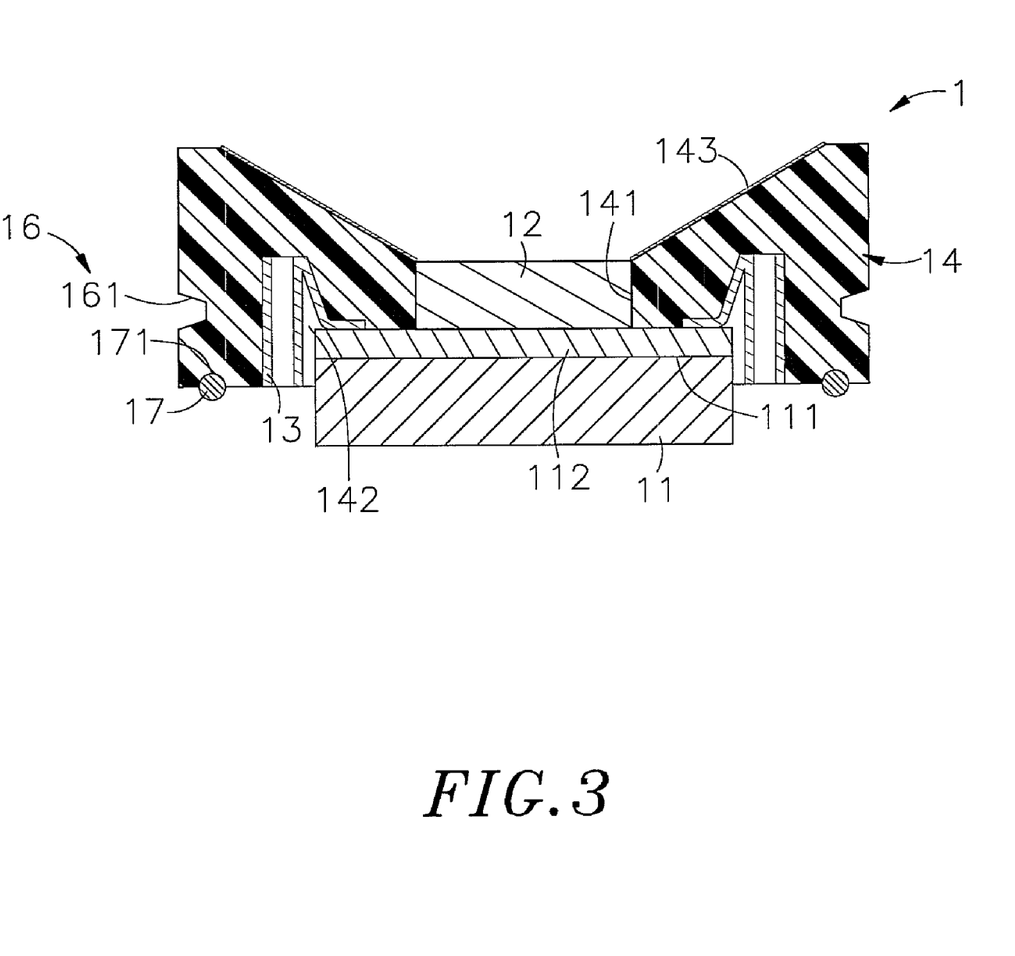
FIG. 3 is a schematic sectional side view, showing a packing cup molded on the circuit substrate and the conducting terminals around the LED chi during the fabrication of a LED module according to the present invention.
Figure 4:
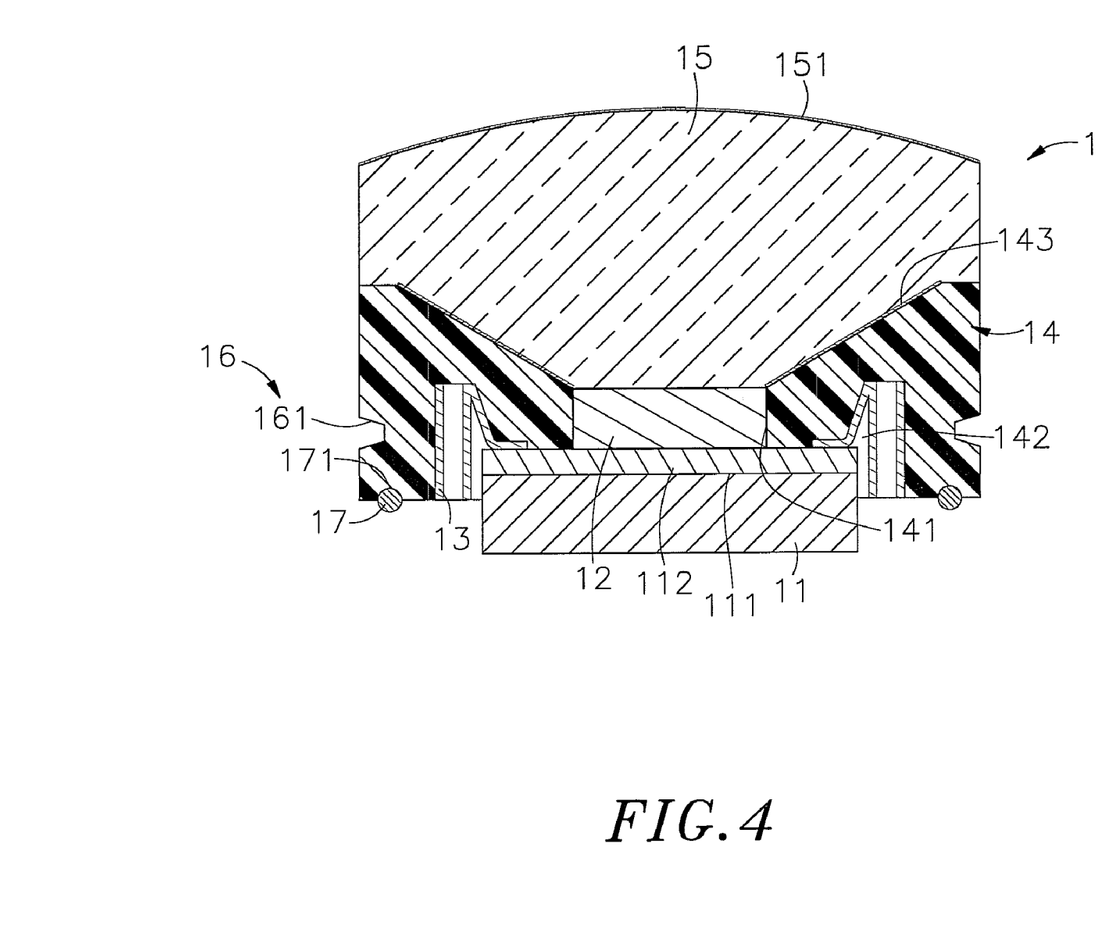
FIG. 4 is a schematic sectional side view, showing a lens molded on the packing cup during the fabrication of a LED module according to the present invention.

Referring to FIGS. 1~5, a LED module fabrication method in accordance with the present invention is shown comprising the steps of:

(101) Bonding, where at least one LED (light emitting diode) chip 12 and a plurality of conducting terminals 13 are bonded to a circuit substrate 11 for LED module 1 by SMT (surface mount technology) or through-hole technology;

(102) Injection molding, where a packing cup 14 is molded on the circuit substrate 11 and the conducting terminals 13 around the LED chip 12 by over-molding, having a top opening 141 and a bottom opening 142 through which the LED chip 12 and the conducting terminals 13 are exposed to the outside;

(103) Mirror finishing, wherein a reflection mirror 143 is formed on the surface of the top opening 141 of the packing cup 14 by means of a metal coating, screen printing or spray painting technique for reflecting light emitted by the LED chip 12;

(104) Secondary injection molding, where a lens 15 is molded on the top surface of the packing cup 14 and the top surface of the LED chip 12 subject to a predetermined shape by means of over-molding; and (105) Coating treatment, whereon a brightness enhancement film 151 is formed on the outer surface of the lens 15 by means of a single-layer or multilayer coating method.

During the aforesaid LED module fabrication steps, at least one LED (light emitting diode) chip 12 and a plurality of conducting terminals 13, for example, one LED chip 12 and two conducting terminals 13 are bonded to a circuit substrate 11 for LED module 1 by SMT (surface mount technology) or through-hole technology. The circuit substrate 11 can be a copper-based circuit board, aluminum-based circuit board, ferrous-based circuit board, copper-clad ceramic circuit substrate or any high conduction circuit substrate. Thereafter, the packing cup 14 is molded on the circuit substrate 11 and the conducting terminals 13 around the LED chip 12 by over-molding. The packing cup 14 has a top opening 141 through which the LED chip 12 is exposed to the outside, and a bottom opening 142 through which the conducting terminals 13 is exposed to the outside. Further, the packing cup 14 can be molded from polycarbonate (PC), polymethylmethacrylate (PMMA) or any other opaque polymers. Thereafter, a reflection mirror 143 is formed on the surface of the top opening 141 of the packing cup 14 by means of a metal coating, screen printing or spray painting technique for reflecting light emitted by the LED chip 12. The reflection mirror 143 can be a smooth surface, checked surface, or multi-face surface design prepared from aluminum or silver. Thereafter, a lens 15 is molded on the top surface of the packing cup 14 and the top surface of the LED chip 12 subject to a predetermined shape by means of over-molding. The lens 15 can be a focus lens or diffuse lens with a 60 to 120 degrees angle. The lens 15 can be molded from polycarbonate (PC), polymethylmethacrylate (PMMA), transparent polyolefine or any of a variety of other polymers having excellent light transmittance. Thereafter, the brightness enhancement film 151 is formed on the outer surface of the lens 15 by means of a single-layer or multilayer coating method. The brightness enhancement film 151 can be magnesium fluoride, quartz or any suitable coating material for light interference and ultraviolet light filtration to enhance the brightness of visible light passing therethrough. By means of a secondary injection molding step to mold the lens 15 on the packing cup 14 and the LED chip 12, no any gap is left in the lens 15, avoiding deflection, total reflection or light attenuation due to the presence of gaseous media, enhancing luminous brightness and assuring uniform distribution of output light.

Figure 6:
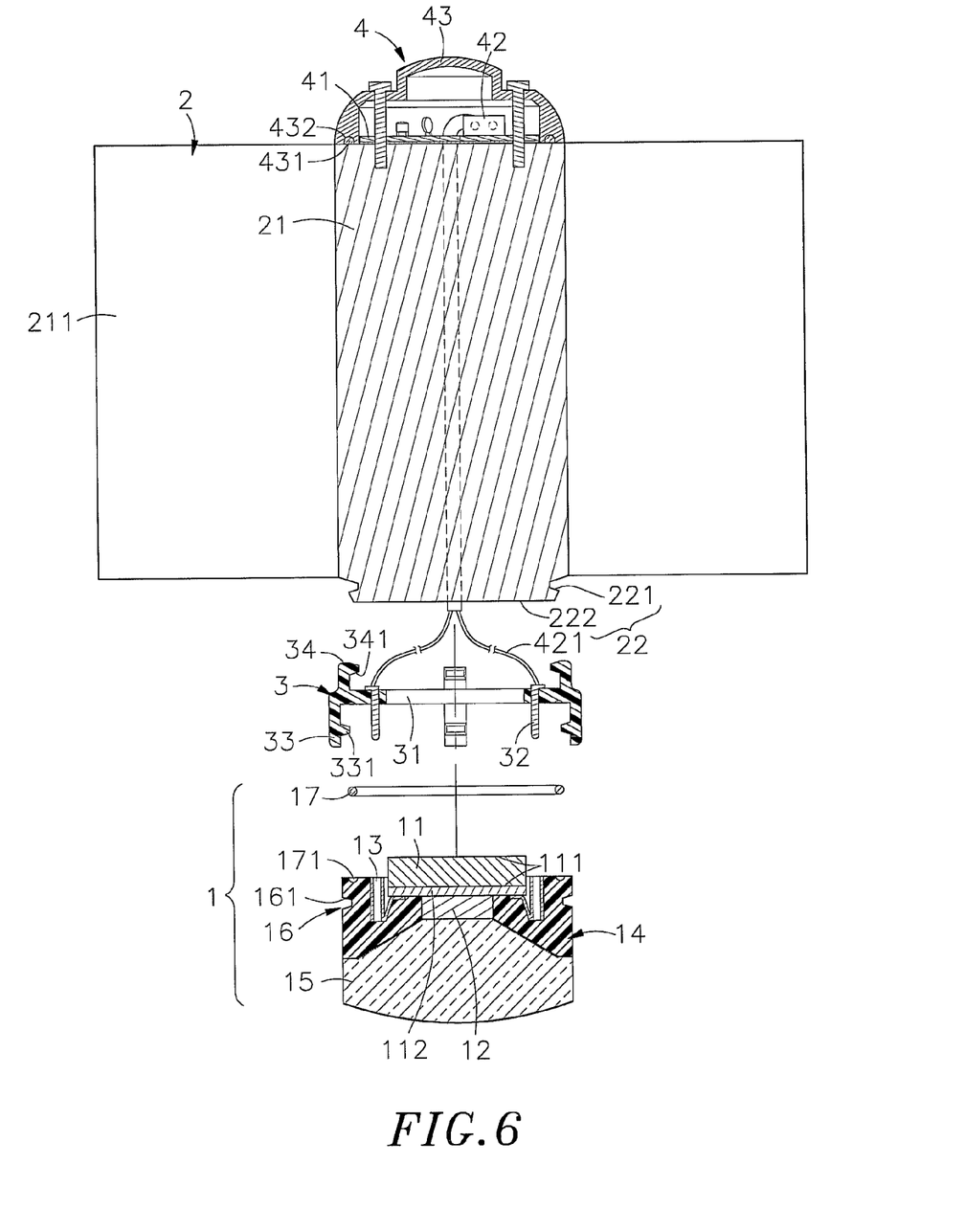
FIG. 6 is a sectional exploded view of a LED lamp module constructed according to the present invention.
Figure 7:
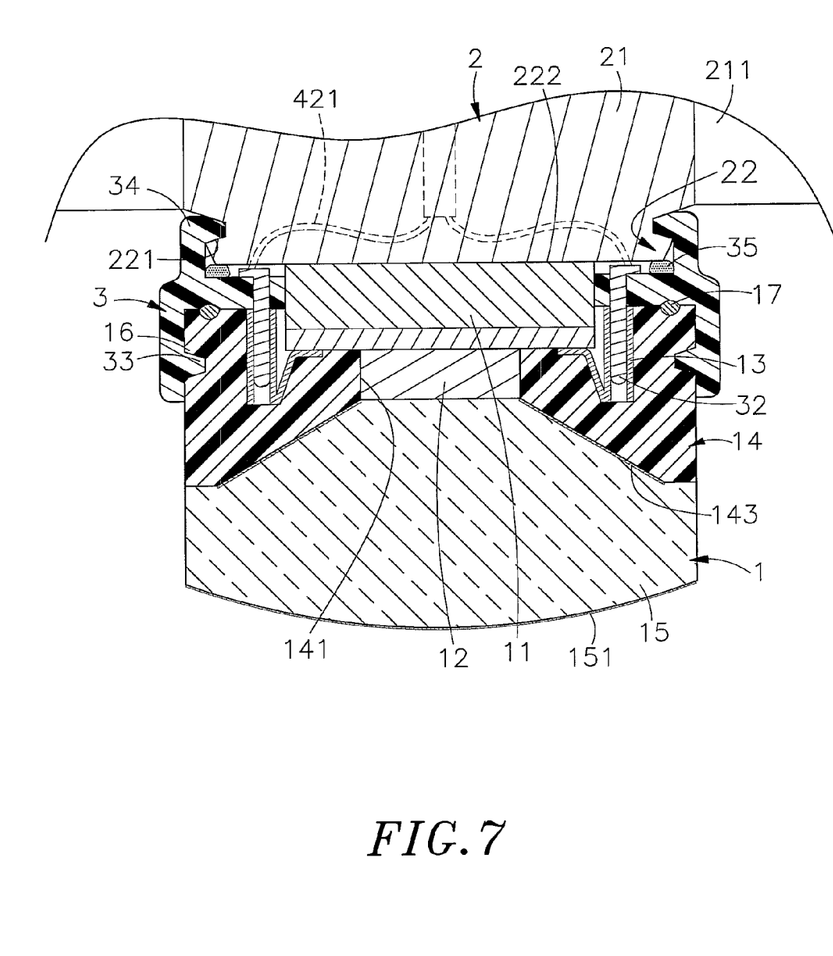
FIG. 7 is a schematic sectional assembly view of a part of the LED lamp module constructed according to the present invention.

Referring to FIGS. 6 and 7, a LED lamp module is shown comprising a LED module 1, a heat sink 2, a bracket 3 and a power control module 4.

The LED module 1 comprises a circuit substrate 11 having opposing bearing walls 111 and a circuit layer 112 arranged on one bearing wall 111, at least one, for example, one LED chip 12 bonded to the circuit layer 112, two conducting terminals 13 bonded to the circuit layer 112 and electrically connected to the LED chip 12 at two opposite lateral sides, a cup 14 molded on the circuit substrate 11 and the conducting terminals 13 around the LED chip 12 by over-molding for enabling the LED chip 12 and the conducting terminals 13 to be exposed to the outside and having a retaining portion 16, for example, a retaining groove 161 extending around the periphery thereof and a locating groove 171 located on the bottom wall thereof around the circuit substrate 11, a lens 15 molded on the top surface of the packing cup 14 and the top surface of the LED chip 12 by means of over-molding, and a water seal ring 17 mounted in the locating groove 171.

The heat sink 2 comprises a cylindrical base 21 set in vertical, a plurality of radiation fins 211 spaced around the periphery of the cylindrical base 21, a flat mounting block 22 located on the bottom end of the cylindrical base 21, a retaining groove 221 extending around the periphery of the flat mounting block 22, and a flat contact face 222 located on the bottom side of the flat mounting block 22 opposite to the cylindrical base 21.

The bracket 3 has a center opening 31 cut through the top and bottom sides thereof and adapted for accommodating the circuit substrate 11 of the LED module 1, positive and negative electrodes 32 disposed at two opposite lateral sides relative to the center opening 31, at least three first retaining members 33 downwardly extended from the bottom wall thereof and equiangularly spaced around the center opening 31, and at least three second retaining members 34 upwardly extended from the top wall thereof and equiangularly spaced around the center opening 31. The first retaining members 33 and the second retaining members 34 each have a springy hooked portion 331 or 341 near the respective distal end and adapted for hooking in the retaining groove 161 at the packing cup 14 of the LED module 1 and the retaining groove 221 at the flat mounting block 22 of the heat sink 2 respectively.

The power control module 4 comprises a control circuit board 41 carrying a plurality of electronic components, an electrical connector 42 installed in the control circuit board 41 and electrically connected to the positive and negative electrodes 32 at the bracket 3 by electrical wires 421, a cover shell 43 capped on the top end of the cylindrical base 21 of the heat sink 2 over the control circuit board 41 and the electronic components and electrical connector 42 at the control circuit board 41, and a water seal ring 431 mounted in a locating groove 432 on the bottom edge of the cover shell 43 and stopped against the cylindrical base 21 of the heat sink 2 to seal off outside moisture.

During installation, the bracket 3 and the heat sink 2 are fastened together by: attaching the bracket 3 to the mounting block 22 of the heat sink 2 to force the springy hooked portions 341 of the second retaining members 34 of the bracket 3 into engagement with the retaining groove 221 at the flat mounting block 22 of the heat sink 2, and then applying a waterproof adhesive, for example, a silicone adhesive 35 to the inside of the bracket 3 to seal off the gap in between the bracket 3 and the heat sink 2 against outside moisture and dust.

Thereafter, the bracket 3 to the LED module 1 are fastened together by: forcing the springy hooked portions 331 of the first retaining members 33 of the bracket 3 into engagement with the retaining groove 161 at the packing cup 14 of the LED module 1 and simultaneously fitting the positive and negative electrodes 32 at the bracket 3 into the tubular conducting terminals 13 at the circuit substrate 11 of the LED module 1 tightly. At this time, one bearing wall 111 of the circuit substrate 11 is inserted into the center opening 31 of the bracket 3 and stopped against the flat contact face 222 of the flat mounting block 22 of the heat sink 2, and the water seal ring 17 that is positioned in the endless locating groove 171 is squeezed in between the LED module 1 and the bracket 3 to prohibit entrance of outside moisture and dust from entering the packing cup 14, avoiding a short circuit, failure or any damage.

During application of the LED lamp module, the power control module 4 provides the necessary working power for the LED module 1, causing the LED chip 12 to emit light. Further, because the LED chip 12 is accommodated in the packing cup 14 and the lens 15 is directly molded on the packing cup 14 over the LED chip 12 through a secondary packaging process, no any gap is left between the packing cup 14 and the lens 15, thus, light emitted by the LED chip 12 passes directly through the lens 15, avoiding refraction, total reflection or light attenuation. Therefore, the invention greatly enhances the amount of luminous flux of the LED chip 12 in direction toward the lens 15. Further, as stated above, one bearing wall 111 of the circuit substrate 11 is stopped against the flat contact face 222 of the flat mounting block 22 of the heat sink 2. Thus, waste heat produced during operation of the LED module 1 is rapidly transferred from the circuit substrate 11 through the flat mounting block 22 to the cylindrical base 21 and then effectively and rapidly dissipated into air through the radiation fins 211, avoiding heat accumulation in the LED module 1 to affect normal functioning or to shorten the lifespan of the LED and heat sink module.

Further, the LED module 1 is detachably fastened to the heat sink 2 by the bracket 3. If the LED module 1 failed after a long use, the LED module 1 can be detached from the heat sink 2 for a replacement conveniently. This detachable arrangement facilitates change or replacement of the LED module 1 or the heat sink 2. For example, a different LED module of the same design but having a different color rendering index can be selectively used and fastened to the heat sink 2 to replace the originally used LED module 1.

Figure 5:
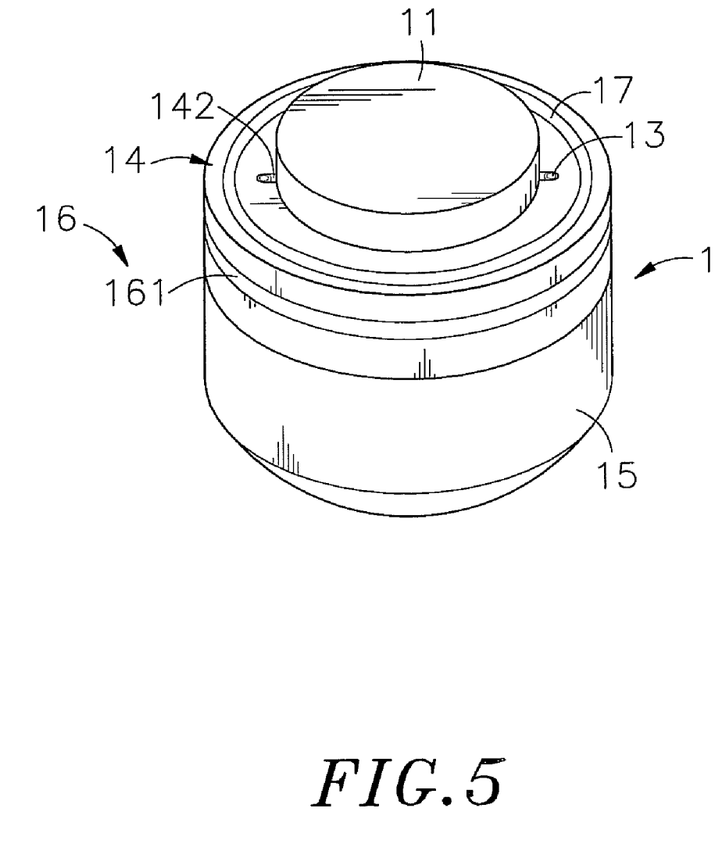
FIG. 5 is an elevational view of a finished LED module made according to the present invention.
Figure 8:
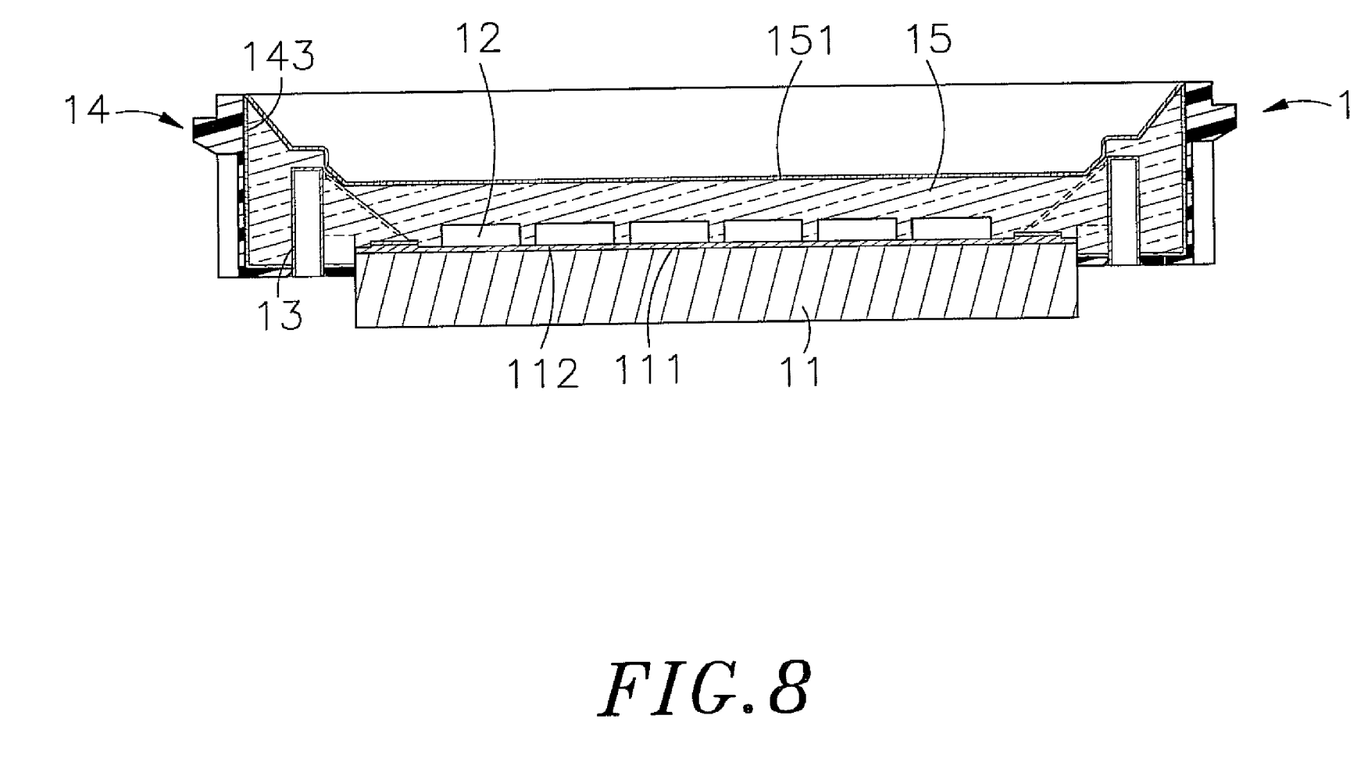
FIG. 8 is a sectional side view of an alternate form of the LED module made according to the present invention.

Referring to FIGS. 1, 5 and 8, the LED module fabrication method is not limited to the aforesaid embodiment. As an alternate form of the present invention, a lens 15 is molded on the circuit substrate 11 over the LED chip 12 and the conducting terminals 13 by over-molding, and then the periphery of the lens 15 is processed to provide a reflection mirror 143, and an packing cup 14 is molded on the lens 15 by means of over-molding, and then a brightness enhancement film 151 is formed on the outer surface of the lens 15 by means of a single-layer or multilayer coating method.

Although particular embodiments of the invention have been described in detail for purposes of illustration, various modifications and enhancements may be made without departing from the spirit and scope of the invention.

What the invention claimed is:

1. A LED module fabrication method, comprising the steps of:
   (a) bonding at least one LED chip and a plurality of conducting terminals to a circuit substrate for enabling said conducting terminals to be electrically connected to positive and negative poles of each said LED chip;
   (b) molding a packing cup on said circuit substrate over said conducting terminals by over molding for enabling said at least one LED chip and said conducting terminals to be exposed to the outside of said packing cup through a top opening and a bottom opening of said packing cup; and
   (c) molding a lens on a top surface of said packing cup and a top surface of each said LED chip by over-molding.

2. The LED module fabrication method as claimed in claim 1, wherein said at least one LED chip and said conducting terminals are bonded to said circuit substrate by surface mount technology.

3. The LED module fabrication method as claimed in claim 1, wherein said circuit substrate is a high conduction circuit substrate selected from a group consisting of copper-based circuit board, aluminum-based circuit board, ferrous-based circuit board and copper-clad ceramic substrate.

4. The LED module fabrication method as claimed in claim 1, further comprising a sub-step of forming a reflection mirror on an outer surface of said packing cup around said at least one LED chip by means of one of metal coating, screen printing and spray painting techniques after step (b).

5. The LED module fabrication method as claimed in claim 4, wherein said reflection mirror is prepared from one of the materials of aluminum and silver in one of the forms of a smooth surface, checked surface and multi-face surface design.

6. The LED module fabrication method as claimed in claim 1, further comprising a sub-step of forming a locating groove on a bottom wall of said packing cup around said circuit substrate for the mounting of a water seal ring.

7. The LED module fabrication method as claimed in claim 1, wherein said packing cup is selected from a material group consisting of polycarbonate (PC) and polymethylmethacrylate (PMMA) and opaque polymers.

8. The LED module fabrication method as claimed in claim 1, further comprising step (d) of forming a brightness enhancement film on an outer surface of said lens by means of one of single-layer coating method and multilayer coating method.

9. The LED module fabrication method as claimed in claim 8, wherein said brightness enhancement film is selected from a material group consisting of magnesium fluoride and quartz.

10. The LED module fabrication method as claimed in claim 1, wherein said lens is a focus lens, having an optical angle within the range of 60 to 120 degrees.

11. The LED module fabrication method as claimed in claim 1, wherein said lens is a diffuse lens, having an optical angle within the range of 60 to 120 degrees.

12. The LED module fabrication method as claimed in claim 1, wherein said lens is selected from a material group consisting of polycarbonate (PC), polymethylmethacrylate (PMMA) and transparent polyolefine.

* * * * *